United States Patent [19]

Ohba et al.

[11] 4,349,743
[45] Sep. 14, 1982

[54] SOLID-STATE IMAGING DEVICE

[75] Inventors: Shinya Ohba; Shoji Hanamura, both of Kokubunji; Toshifumi Ozaki, Tokyo; Masaharu Kubo, Hachioji; Masaaki Nakai, Kodaira; Kenji Takahashi, Kodaira; Masakazu Aoki, Kodaira; Iwao Takemoto, Tokyo; Haruhisa Ando, Hachioji; Ryuichi Izawa, Kokubunji, all of Japan

[73] Assignee: Hitachi, Ltd., Tokyo, Japan

[21] Appl. No.: 206,865

[22] Filed: Nov. 14, 1980

[30] Foreign Application Priority Data

Nov. 14, 1979 [JP] Japan ............................ 54-157030[U]

[51] Int. Cl.³ .............................................. H01L 27/14
[52] U.S. Cl. ........................................ 250/578; 357/32
[58] Field of Search ................ 250/578, 211 J; 357/32

[56] References Cited

U.S. PATENT DOCUMENTS 4,288,702  9/1981  Ozawa et al. ............... 250/578

Primary Examiner—David C. Nelms
Assistant Examiner—Darwin R. Hostetter
Attorney, Agent, or Firm—Craig and Antonelli

[57] ABSTRACT

A solid-state imaging device wherein a MOS sensor is employed for a photosensor part, a CTD shift register is employed for a read-out circuit, first and second transfer gates are connected between vertical signal output lines and the CTD, and a reset gate is connected between a juncture of the first and second transfer gates and a reset voltage line. A method is adopted in which signal outputs of a plurality of rows are transferred to the CTD in a horizontal blanking period, and signals of a plurality of rows are simultaneously read out in a horizontal scanning period. At the signal transfer, bias charges are dumped into the vertical signal output lines from the CTD, and mixed charges consisting of the bias charges and signal charges are transferred to the CTD. Thereafter, the signals are read out.

10 Claims, 15 Drawing Figures

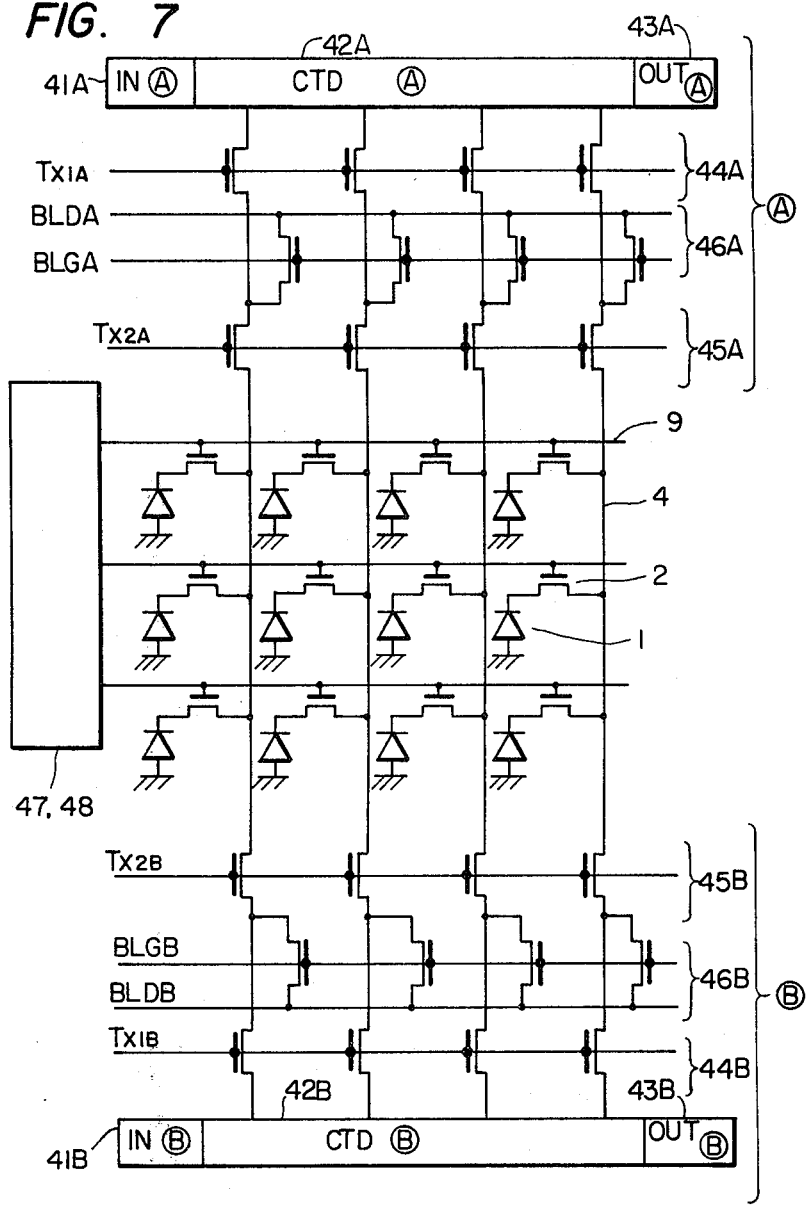

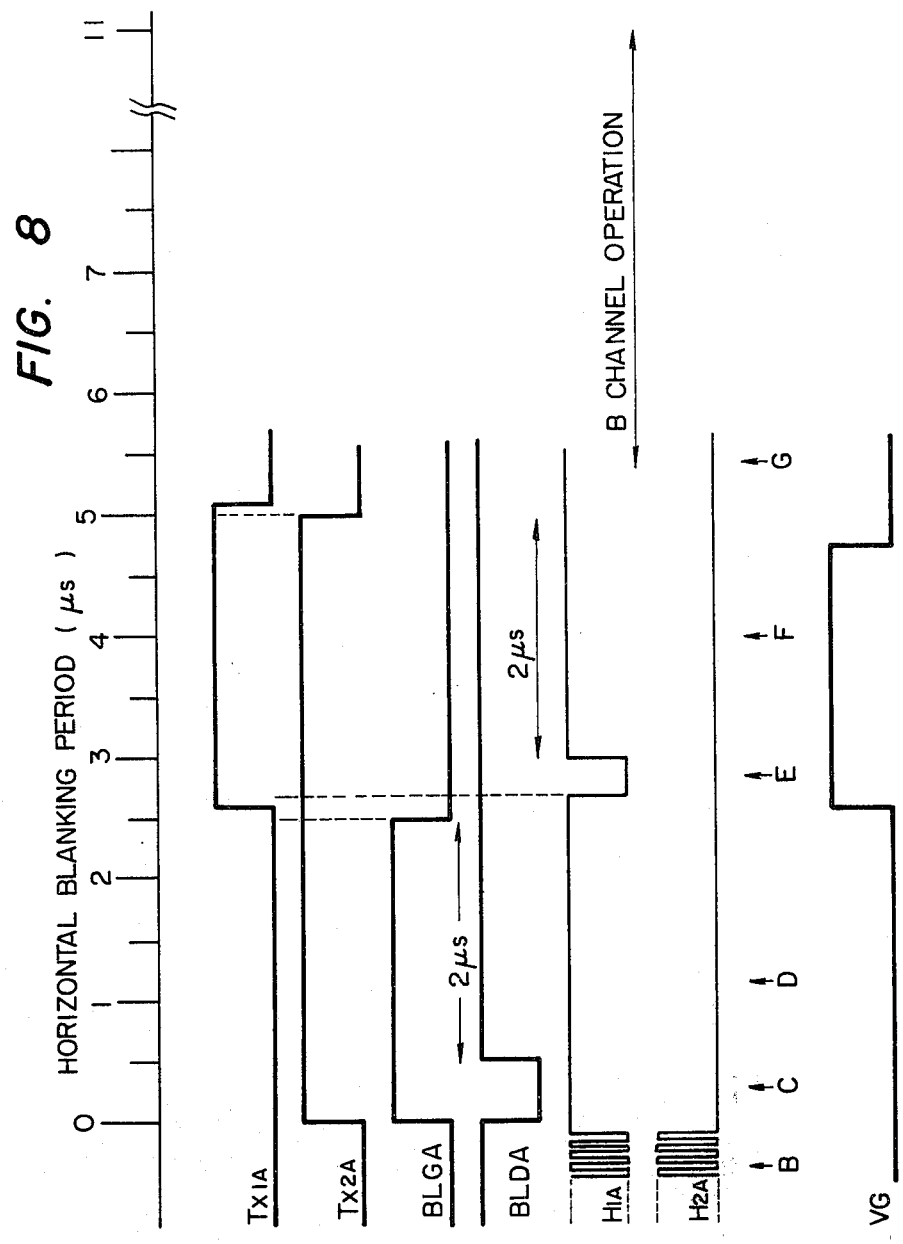

SOLID-STATE IMAGING DEVICE

BACKGROUND OF THE INVENTION

This invention relates to a solid-state imaging device for use in a television camera etc. Particularly, it relates to a solid-state imaging device which has a plurality of picture elements disposed in a surface region of a semiconductor body. More specifically, it relates to a solid-state imaging device which has picture elements for reading out from photodiodes thereof photo information stored therein.

As solid-state imaging devices (hereinbelow, termed "image sensors"), the two sorts of a MOS-type device and a CTD-type device have been known. As compared with the latter, the former is higher in the sensing efficiency of light per chip size and is also higher in the sensitivity, but it provides a smaller output signal and is more difficult of signal processing. In such manner, each type has both merits and demerits, so that the known devices have not attained to the performance of a practical level yet.

As an image sensor to solve this problem, there has already been proposed an MCD (MOS-CCD Device) imaging device as shown in FIG. 1, that is, an image sensor which employs a MOS-type structure for a photosensing part and a CTD-type structure for a read-out shift register (Japanese Published Unexamined Utility Model Registration Application No. 54-99579, laid open July 13, 1979).

FIG. 1 shows a photosensor in which a photodiode and an insulated-gate field effect transistor (abbreviated to "MOST") are disposed as a picture element, and a CTD (Charge Transfer Device) is disposed as a read-out register. In the figure, numeral 1 designates a photodiode constructed of a p-n junction utilizing the source junction of a MOST, numeral 2 a vertical switching MOST (abbreviated to "VMOST"), numeral 3 a scanning circuit for sequentially switching the MOSTs 2 by means of clock pulses $\phi_v$, numeral 4 a vertical signal output line, numeral 5 a horizontal switching MOST (hereinbelow, abbreviated to "HMOST"), numeral 6 a CTD as a read-out shift register, numeral 7 a preamplifier connected to the CTD 6, numeral 8 a signal output terminal, and numeral 9 a vertical scanning line. Signal charges which have been read out from the photodiodes through the VMOSTs onto the vertical signal output lines 4 in synchronism with the pulses $\phi_v$ from the scanning circuit 3 are sent through the HMOSTs 5 to the CTD 6 in synchronism with pulses $\phi_x$ and are read out from the pre-amplifier 7 in succession.

As regards the image sensor shown in FIG. 1, excellent characteristics were expected as a device with the merits of the MOS type and the CTD type combined, but in actuality only a very unsatisfactory performance has been obtained for reasons as stated below.

FIG. 2 is a circuit diagram for explaining a problem of the MCD image sensor shown in FIG. 1. In FIG. 2, numeral 10 typically indicates one of the VMOSTs, numeral 11 the corresponding photodiode, numeral 12 one of the HMOSTs, and numeral 13 one transfer and/or storage electrode of the CTD which is the horizontal read-out shift register.

Letting $C_p$, $C_v$ and $C_c$ denote the respective capacitances of the photodiode 11, the vertical signal output line 14 and the CTD electrode 13 illustrated in FIG. 2, the following relation holds usually:

$$C_v >> C_p, C_c \tag{1}$$

Among the signal charges $Q_v$ delivered to the vertical signal output line, a quantity $Q_c$ of charges which are put into the CTD is:

$$Q_c \approx Q_v (C_c/C_v) \tag{2}$$

Herein, however, $Q_c << Q_v$ holds, so that the signal charges cannot be taken into the CTD sufficiently. Further, a potential change $\Delta V_v$ based on the charges $Q_v$ taken out to the vertical signal output line 14 is very small as compared with a potential change $\Delta V_p$ based on a photo signal in the photodiode part, as follows:

$$V_v \approx V_p (C_p/C_v) \tag{3}$$

Accordingly, even when the pulse $\phi_x$ has turned "on," the HMOST 12 does not fall into a sufficient conductive state, so that the transfer time of charges is very long and that a satisfactory transfer cannot be executed.

FIG. 3 is an equivalent circuit diagram of a solid-state imaging device which has solved the above problem and which has been proposed by M. Aoki, I. Takemoto, S. Ohba and M. Kubo (Japanese Published Unexamined Utility Model Registration Application No. 55-108756, laid open July 30, 1980). In the figure, numerals 10-14 indicate the same parts as in FIG. 2. In FIG. 3, a transfer MOST (transfer gate) 15, a storage capacitor (storage gate) 16 and a reset MOST (reset gate) 17 are disposed between the vertical signal output line 14 and the HMOST 12.

FIG. 4 is a diagram showing an example of the timings of driving pulses for the image sensor of FIG. 3, and a direction indicated by arrow 30 denotes the "on" state. Hereunder, the operation of the circuit of FIG. 3 will be described with reference to the timings in FIG. 4.

First, before the signal stored in the photodiode 11 is read out, the pulses $\phi_t$, $\phi_s$ and $\phi_R$ are successively turned "on" as indicated at 22, 23 and 24. Thus, a spurious signal or spurious charges due to dark current etc. having been stored during a horizontal scanning period $t_H$ (29) is/are derived from the reset gate 17, and a potential underneath the storage gate 16 is reset to $V_R$. Subsequently, the pulses $\phi_v$, $\phi_t$, $\phi_s$ and $\phi_x$ are successively turned "on" as indicated at 25, 26, 27 and 28, to transfer the signal to under the storage electrode 13 of the CTD. Here, if $V_R$ is set in advance so that when $\phi_t$ has fallen into the "on" state charges may flow onto the side of the vertical signal output line 14 from a source which is a part underneath the storage gate 16, then the potential of the vertical signal output line 14 can be lowered and the transfer gate 15 falls into a sufficient conductive state. For this reason, when subsequently $\phi_s$ has fallen into the "on" state and the part underneath the storage gate 16 has become the drain side conversely to the above, the charges having flowed in previously and the signal charges can be shifted from the side of the vertical signal output line 14 onto the side of the storage gate 16 in a short time. More specifically, a predetermined quantity of charges are fed to the vertical signal output line 14 from the side of the reset gate 17, and they are caused to flow back onto the side of the storage gate 16 together with the signal charges sent from the side of the diode 11 and are further shifted to the CTD. Thus, it becomes possible to feed most of the signal charges to the CTD in a short time. (The transfer operation stated above is fully performed within a horizontal blanking signal $t_B$ (21 in FIG. 4).)

Here, it is also considered that the reset gate 17 is directly connected with, for example, the vertical signal output line 14. With such connection, however, since $C_v >> C_p$, $C_c$ and $C_s$, even a slight change of the potential $V_R$ results in a great change of the quantity of charges, and potential changes underneath the storage gate 16 and the CTD electrode 13 become great, so that a strict control of $V_R$ is needed and that satisfactory characteristics are actually difficult to attain. It is therefore very important to interpose the reset gate 17 between the transfer gate 15 and the HMOST 12.

FIG. 5 is a diagram showing an example which is based on the principle described above. Numerals 1–7 indicate the same parts as in FIG. 1, and numeral 31 designates a transfer gate, numeral 32 a storage gate and numeral 33 a reset gate.

With this system, however, deviations involved in the storage capacitors of respective columns (16 or $C_s$ in FIG. 3, or 32 in FIG. 5) result in the deviations of the signal charges of the respective columns, and the so-called fixed pattern noise in the form of vertical stripes of light shade is noted on a monitor screen obtained by the use of this solid-state imaging device.

SUMMARY OF THE INVENTION

An object of this invention is to provide an image sensor employing a MOS-type structure for a photosensing part and a CTD-type structure for a read-out shift register, which image sensor can transfer signal charges to the CTD register sufficiently.

Another object of this invention is to provide an image sensor employing a MOS-type structure for a photosensing part and a CTD-type structure for a read-out shift register, which image sensor is free from the appearance of fixed pattern noise.

In order to accomplish the objects, according to an MCD image sensor of this invention, bias charges are supplied to a CTD, the bias charges are dumped into a vertical signal output line so as to be mixed with signal charges, the bias charges and the signal charges as mixed are transferred to the CTD, and a signal is read out by means of the CTD.

According to an image sensor of this invention, in an MCD image sensor wherein a MOS sensor (a sensor in which picture elements each consisting of a photodiode and a VMOST are arrayed in the form of a matrix) is arranged in a photosensing part and a CTD as a read-out shift register is further disposed, a signal is transferred to the read-out CTD register after setting the potential of a vertical signal output line to a reference voltage, whereby a high picture quality with reduced fixed pattern noise is obtained.

BRIEF DESCRIPTION OF THE DRAWINGS

FIG. 7 is a schematic circuit diagram showing an embodiment of the MCD image sensor according to this invention.

FIG. 8 is a pulse timing diagram of driving pulses for an A-channel in the MCD image sensor of FIG. 7.

DESCRIPTION OF THE PREFERRED EMBODIMENTS

Figure 1:
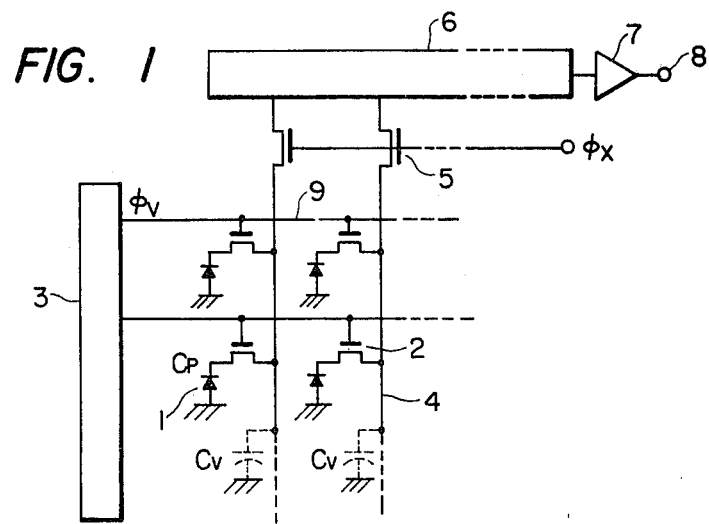
FIG. 1 shows a schematic circuit diagram of a prior-art MCD image sensor which employs a MOS sensor for a photosensing part and a CTD for a reading-out circuit.
Figure 2:
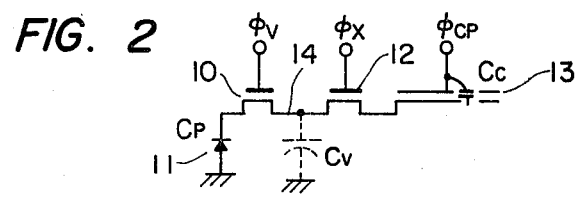
FIG. 2 shows an equivalent circuit of a transfer path of signal charges in the image sensor of FIG. 1.
Figure 3:
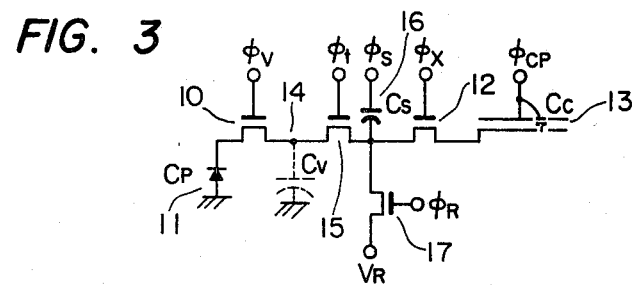
FIG. 3 shows an equivalent circuit of a transfer path of signal charges in an improved MCD image sensor which has been disclosed in Japanese Published Unexamined Utility Model Registration Application No. 55-108756 by M. Aoki et al. being the inventors of the present application.
Figure 4:
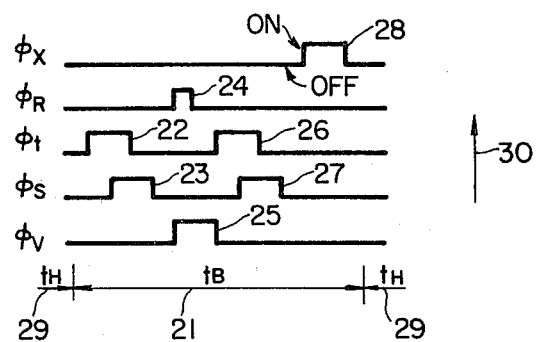
FIG. 4 is a pulse timing diagram showing driving pulses for the MCD image sensor of FIG. 3.
Figure 5:
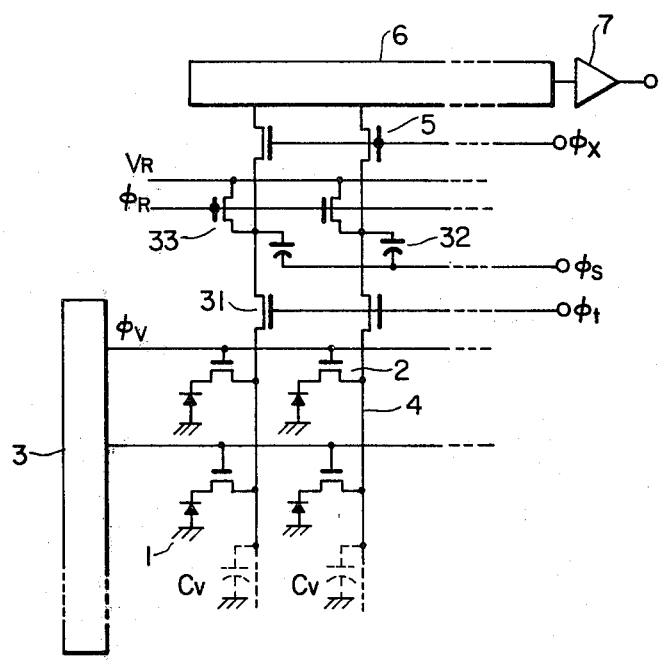
FIG. 5 is a schematic circuit diagram of an MCD image sensor which has the equivalent circuit of FIG. 3.
Figure 6:
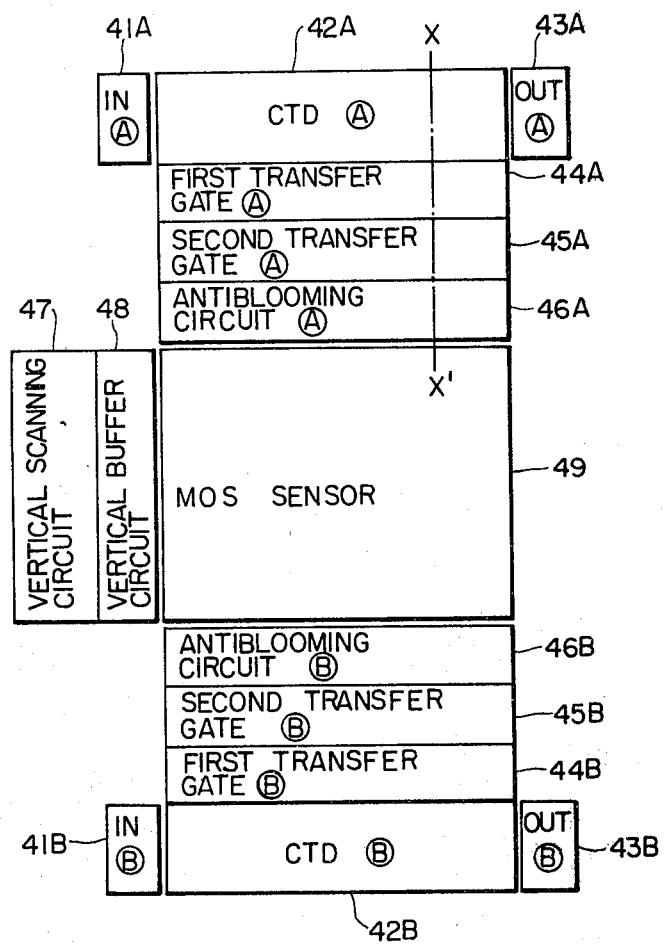
FIG. 6 is a circuit block diagram showing the arrangement of an embodiment of an MCD image sensor according to this invention.
Figure 9A:
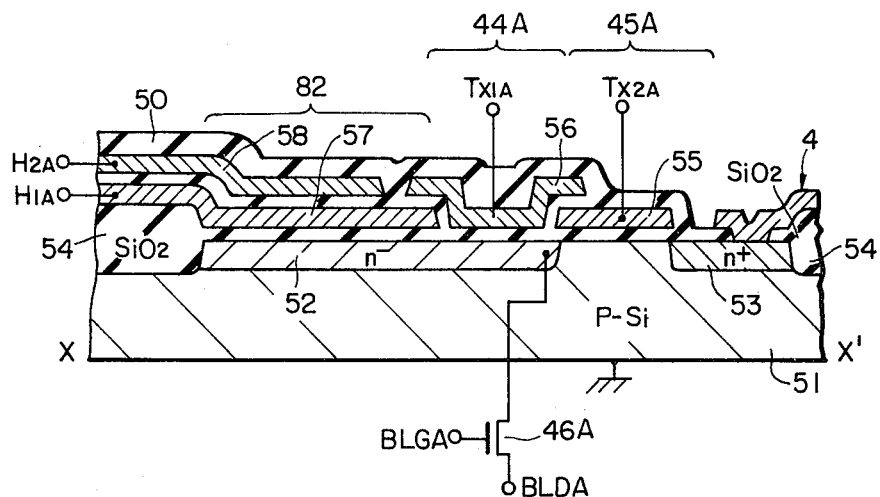
FIG. 9A shows a sectional device structure of the coupling portion between a CTD and a vertical signal output line in the MCD image sensor of FIG. 7.

FIG. 6 is a block diagram of the arrangement of an embodiment of this invention, FIG. 7 is a circuit model diagram, and FIG. 8 is a timing chart of various pulses concerning an A-channel (an upper reading-out circuit in FIG. 6 or 7 as indicated by A). FIG. 9A is a sectional structural diagram of the coupling portion between a CTD (BCD is utilized here; refer to "Bulk Charge-transfer Device" by M. Kubo, Proc. 6th Conf. on Solid State Devices, Tokyo, p. 173, Jan. 1975) and a vertical signal output line. In FIG. 9A, numeral 50 designates an insulating film (of $SiO_2$ or the like), numeral 51 an Si body of the p-type conductivity, numeral 52 and $n^-$-type impurity layer, numeral 53 an $n^+$-type impurity layer, numeral 54 an $SiO_2$ layer, numerals 55 and 56 gate electrodes, and numerals 57 and 58 transfer electrodes and/or storage electrodes of the CTD.

In FIG. 6, symbols 41A and 41B indicate input parts of the CTD (such as CCD and BCD), symbols 43A and 43B indicate output parts, and symbols 42A and 42B indicate charge transfer parts. Numeral 47 denotes a vertical scanning circuit, and numeral 48 a buffer circuit. Shown at 49 is a MOS photosensor part in which picture elements each consisting of a photodiode and a vertical switching MOS transistor (VMOST) are arranged into a matrix. Symbols 44A and 44B represent first transfer gates, symbols 45A and 45B second transfer gates and symbols 46A and 46B antiblooming circuits, and concrete circuits of the respective constituents are shown in FIG. 7.

A point in the operation of this device is that the signal charges of the vertical signal output line 4 are transferred to the CTD register within a horizontal blanking period. In the following, therefore, description will be made with reference to the pulse timing diagram of FIG. 8 and the sectional view of FIG. 9A. FIG. 9A is the sectional view of a part corresponding to X–X' in the block diagram of FIG. 6. FIGS. 9B to 9G illustrate channel potentials at times which correspond to B to G in FIG. 8, respectively. Further, shown by broken lines are a potential (BLGA) underneath the gate of the MOST 46A and a potential of a terminal BLDA. Numeral 51 indicates bias charges, numeral 52 blooming charges, and numeral 53 a reference level.

Figure 9B:
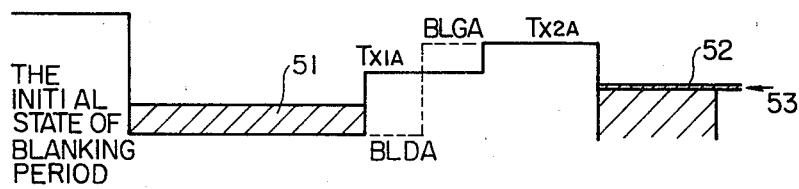
FIGS. 9B, 9C, 9D, 9E, 9F and 9G are diagrams showing surface potentials in various nodes during the charge transfer operation of the MCD image sensor of FIG. 7, respectively.
Figure 9C:
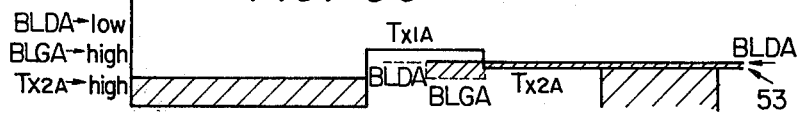

In a horizontal scanning period, the CTD operates to transfer the respective signals to its output stage, and simultaneously, predetermined bias charges are successively transferred from the input part. Various methods are considered for supplying the bias charges. As one method, the input terminal and input gate of the CTD (here, BCD) may be biased to predetermined voltages. At the end of the horizontal scanning period, all the signals have been read out, and the predetermined quantities of bias charges (electrons are considered here) are existent in the respective stages of the CTD. This state is shown in FIG. 9B.

Figure 9D:

When, upon initiation of a horizontal blanking period, pulses $T_{X2A}$ and BLGA become "high" and the potential BLDA becomes "low," charges (here, electrons) flow from the terminal BLDA into the vertical signal output line. (FIG. 9C) Thereafter, when BLDA is made "high," contrariwise the charges flow out from the vertical signal output line to BLDA, and the vertical signal output line is clamped to a potential $V_{VCA}$ given by the following expression, so that the outflow of the charges stops. (FIG. 9D)

$$V_{VCA} = V_{X2A} - V_{thX2A} \quad (4)$$

where $V_{X2A}$ and $V_{thX2A}$ denote the "high" level of $T_{X2A}$ and the effective threshold voltage (including the substrate bias effect) of the second transfer gate 45A, respectively.

Figure 9E:
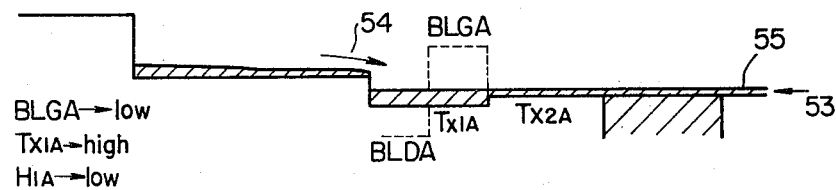
Figure 9F:
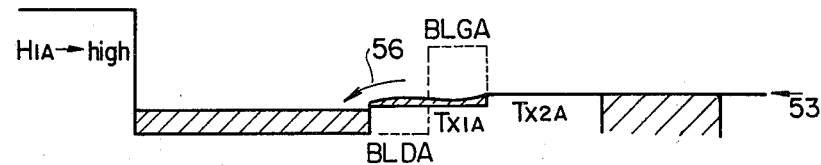

In FIG. 9E, BLGA becomes "low," and BLGA and BLDA are not concerned in the subsequent operation. Next, when $T_{X1A}$ becomes "high" and $H_{1A}$ being the shift pulse of the CTD is made "low," the bias charges sent from the input part of the CTD are transferred to the respective vertical signal output lines (54). The relationship of the respective potentials needs to be set in advance so that the charges may not shift to the adjacent electrodes of the CTD when the pulse $H_{1A}$ becomes "low". Concretely, letting $V_{thCA}$, $V_{thX1A}$, $H_{2AL}$ and $V_{X1A}$ denote the threshold voltage of the channel of the CTD, the threshold voltage of the first transfer gate 44A, the "low" level of the shift pulse $H_{2A}$ of the CTD and the "high" level of the transfer pulse $T_{X1A}$, respectively, the following relation may be held:

$$V_{X1A} - V_{thX1A} \geqq H_{2AL} - V_{thCA} \quad (5)$$

At this time, when a certain vertical scanning line (corresponding to 9 in FIG. 7; potential VG) becomes "high," the signal charges (here, electrons) of the photodiodes in the corresponding row shift to the respective vertical signal output lines and mix with the bias charges from the CTD. The mixed charges are shown at 55.

Subsequently, when the shift pulse $H_{1A}$ of the CTD is made "high" (FIG. 9F), the bias charges and the signal charges existent in the vertical signal output line flow to the CTD until the vertical signal output line becomes $V_{VCA}$ in Expression (4) (refer to 56).

Figure 9G:
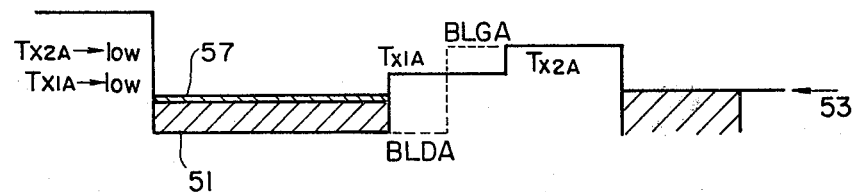

When the transfer pulse $T_{X1A}$ is made "low," the vertical signal output line and the CTD are electrically disconnected. At this time, the CTD stores therein the signal charges 57 from the photodiode in addition to the bias charges 51 having originally been existent. (FIG. 9G)

After the respective vertical signal output lines have been clamped at $V_{VCA}$ and $V_{VCB}$, the bias charges and the desired signal charges enter the vertical signal output lines and the signals are shifted to the CTD, whereupon the vertical signal output lines are clamped at $V_{VCA}$ and $V_{VCB}$ again. Therefore, even when the threshold voltages and capacitances of the respective channels and respective columns involve deviations, the fixed pattern noise as observed in the prior-art example does not arise. In other words, a high picture quality and a high signal-to-noise ratio can be attained.

The transfer performance of the charges from the vertical signal output line to the CTD, that is, the transfer efficiency $\eta$ is approximately given by the following expression:

$$\eta = (t_X/t_X + T) \quad (6)$$

where $t_X$ denotes the transfer time, which is 2 μs in FIG. 8. In addition, T is represented by the following expression:

$$T = (2 \cdot C_V^2 / \beta \cdot Q_{SB}) \quad (7)$$

where $C_V$ denotes the capacitance of the vertical signal output line, $\beta$ the serial conductance (unit: $1/V^2$) of the transistors of the transfer gates 44A and 45A, and $Q_{SB}$ the sum between the bias charges and the signal charges. Assuming by way of example that $C_V = 3$ pF, $\beta = 200$ (μI/V²) and $Q_{SB} = 0.5$ pC, then $T = 0.2 \times 10^{-6}$ (s) is calculated, and the transfer efficiency $\eta$ of Expression (6) becomes 90%.

This means that 10% of the charges remain in the vertical signal output line. Since, however, the vertical signal output line is cleared before the read-out of the signal without fail, merely the sensitivity lowers 10% and the resolution is not degraded.

In the above, the operation of putting the signals of the n-th row into the CTD of the A-channel has been described. In the second half of the identical horizontal blanking period, the same operation of shifting the signals of the (n+1)-th row to the other B-channel CTD is carried out. In this way, the CTDs of both the A- and B-channels operate in the horizontal scanning period, and the signals of the two rows are successively read out from the two output stages.

The signal which is read out from the output stage is a mixed signal in which a bias signal and a video signal are superposed. The bias component which is a D.C. component may be immediately removed by a known method. Alternatively, it may be included in the output signal as it is, and an appropriate processing, for example, the correction of a black level or white level voltage may be executed by a signal processing circuit in a succeeding stage. Accordingly, the bias component does not pose any special problem.

It is common that the threshold voltages of the gate devices deviate to some extent (200 mV−10 mV). Regarding the clamp voltage represented by Expression (4), the clamp voltage of the A-channel and that of the B-channel differ even when an identical vertical signal output line is noticed. The MOSTs 46A and 46B function to eliminate the evil effect of the deviations.

Referring to FIG. 9B, in the initial stage of the read-out of the signals, the noise charges 52 such as blooming charges and dark current charges are stored in the vertical signal output line. Moreover, how the potential of the vertical signal output line is cannot be known at all on account of the deviations of the threshold voltages of the MOST 45A of the A-channel and the MOST 45B of the B-channel.

When the "low" level voltages of lines BLDA and BLDB are selected in advance to be below the anticipated lowermost potential of the vertical signal output lines, the vertical signal output lines are clamped at $V_{VCA}$ or $V_{VCB}$ of Expression (4) in FIG. 9D irrespective of the initial potential. That is, the MOSTs 46A and 46B function to clamp the vertical signal output lines to the reference level $V_{VCA}$ of the A-channel in the A-channel and to the reference level $V_{VCB}$ of the B-channel in the B-channel. At the same time, they are effective to sweep away the unnecessary charges ascribable to the blooming and the dark current.

In the above, there has been described the simultaneously-selected two rows method which is the characterizing feature of the present device. Needless to say, however, the conventional method in which signals are read out from only the A-channel without disposing the B-channel can also be employed.

It is usual that the solid-state imaging device performs the interlace-mode operation. Also in the photosensor of this invention, various systems of the interlace-mode operation are considered. Now, an example thereof will be described. In one horizontal scanning period of a certain field (odd field), signals of the n-th row are read out by the A-channel operation and signals of the (n+1)-th row by the B-channel operation, and in one horizontal scanning period of the next field (even field), signals of the (n+1)-th row are read out by the A-channel operation and signals of the (n+2)-th row by the B-channel operation. In this manner, the interlace-mode operation can be effected by the simultaneously-selected two rows method.

The essence of this invention consists in the following two points:

① As bias charges, charges having been shifted by a CTD are utilized. The bias charges are once dumped into vertical signal output lines. Thereafter, mixed charges in which signal charges and the bias charges are mixed are put into the CTD. The mixed charges are transferred and delivered by the CTD.

② Before reading out signals, charges are put into the vertical signal output lines from a resetting voltage terminal through resetting MOSTs, whereby the vertical signal output lines are cleared irrespective of the initial voltages thereof.

It is a matter of course that the photosensor of this invention can be utilized as a black-and-white sensor or a color sensor, or a three-plate type color sensor or a single-plate type sensor.

Although, in the present invention, the BCD (Bulk Charge-transfer Device) has been employed as the CTD, a CCD (Charge Coupled Device) or a BBD (Bucket Brigade Device) may well be used.

What is claimed is:

1. In a solid-state imaging device wherein a photosensor part is constructed of a MOS-type sensor in which picture elements each consisting of a photodiode and a switching insulated-gate field effect transistor are arrayed in the form of a matrix, signal outputs of the respective picture elements of said MOS-sensor are transferred to a CTD (Charge Transfer Device) through signal output lines, and the signal outputs are read out by said CTD; a solid-state imaging device characterized by comprising means for supplying bias charges to said CTD, and signal-transfer means for causing the bias charges to get into said signal output lines so as to mix them with signal charges and for causing the mixed signal charges to get back into said CTD.

2. A solid-state imaging device according to claim 1, wherein said signal-transfer means includes a first transfer gate element which is connected between the signal output line and said CTD.

3. A solid-state imaging device according to claim 2, further comprising reset means for setting a potential of said signal output line to a predetermined reference voltage before the bias charges get into said signal output line.

4. A solid-state imaging device according to claim 3, wherein said reset means includes a second transfer gate element which is connected between said first transfer gate element and said signal output line, and a reset gate element which is connected between a juncture of said first and second transfer gate elements and a reset-voltage line.

5. A solid-state imaging device according to claim 4, wherein said reset means includes means for controlling a potential of said reset voltage line so that, under a conductive state of said second transfer gate element, the charges may get into said signal output line from said reset voltage line, whereupon the charges may get back into said reset voltage line from said signal output line.

6. A solid-state imaging device according to claim 2, wherein said signal-transfer means includes means for controlling a potential of a transfer electrode and/or storage electrode of said CTD so that, under a conductive state of said first transfer gate element, the bias charges stored underneath said transfer electrode and/or storage electrode may get into said signal output line, whereupon the mixed charges may get back into the part under said transfer electrode and/or storage electrode from said signal output line.

7. A solid-state imaging device according to claim 2, 4, 5 or 6, wherein the transfer gate element and the reset gate element are made of insulated-gate field effect transistors.

8. A solid-state imaging device according to claim 1, wherein at least two CTDs are coupled said each signal output line to construct first and second read-out channels by means of the first and second CTDs, and means is comprised for transferring the signal outputs to the first channel in a first half of a horizontal blanking period and for transferring the signal outputs to the second channel in a latter half of the horizontal blanking period.

9. A solid-state imaging device according to claim 8, wherein the signal outputs to be transferred to said first channel are those of an n-th row, while the signal outputs to be transferred to said second channel are those of an (n+1)-th row.

10. A solid-state imaging device according to claim 9, further comprising means for reading out the signal outputs of the n-th and (n+1)-th rows in an odd field and reading out the signal outputs of (n+1)-th and (n+2)-th rows in an even field, thereby to perform an interlacing operation of a simultaneously-selected two rows method.

* * * * *